United States Patent [19]
Dunlop et al.

[11] Patent Number: 4,577,276
[45] Date of Patent: Mar. 18, 1986

[54] PLACEMENT OF COMPONENTS ON CIRCUIT SUBSTRATES

[75] Inventors: Alfred E. Dunlop, New Providence; Brian W. Kernighan, Berkeley Heights, both of N.J.

[73] Assignee: AT&T Bell Laboratories, Murray Hill, N.J.

[21] Appl. No.: 531,423

[22] Filed: Sep. 12, 1983

[51] Int. Cl.$^4$ .............................................. G06F 15/46
[52] U.S. Cl. .................................... 364/491; 364/488; 364/490
[58] Field of Search ............................... 364/488–492, 364/300

[56] References Cited

U.S. PATENT DOCUMENTS 3,617,714  11/1971  Kernighan et al. .................. 364/300

OTHER PUBLICATIONS

"Producing Integrated Circuits from a Circuit Logic Input" by Bilous et al., IBM Technical Disclosure Bulletin, vol. 13, No. 5, Oct. 1970, pp. 1084–1089.
"PRO—An Automatic String Placement Program for Polycell Layout", Proceedings of the 13th Design Automation Workshop, 1976, G. Persky, pp. 417–424.
"A Min–Cut Placement Algorithm for General Cell Assemblies Based on a Graph Representation", Proceedings of the 16th Design Automation Workshop, Jun. 1979, U. Lauther, pp. 1–10.
"An Iterative Algorithm for Placement and Assignment of Integrated Circuits", Proceedings of the 12th Design Automation Workshop, 1975, D. C. Schmidt and L. E. Druffel, pp. 361–368.
"A Placement Capability Based on Partitioning", Proceedings of the 16th Design Automation Workshop, 1979, L. I. Corrigan pp. 406–413.
"Min–Cut Placement", J. Design Automation & Fault Tolerant Computing 1(4), Oct. 1977, M. A. Breuer, pp. 343–362.
"A Proper Model for the Partitioning of Electrical Circuits", Proceedings of the 9th Design Automation Workshop, 1972, D. G. Schweikert and B. W. Kernighan, pp. 57–62.
"An Efficient Heuristic Procedure for Partitioning Graphs", Bell System Technical Journal 49(2), 1970, B. W. Kernighan and S. Lin, pp. 291–308.
"Net Wiring for Large Scale Integrated Circuits", IBM Technical Report RC 1375, Feb. 1965, M. Hanan, pp. 1–17.
"A Linear–Time Heuristic for Improving Network Partitions", Proceedings of the 19th Design Automation Workshop, 1982, C. M. Fiduccia and R. M. Mattheyses, pp. 175–181.

Primary Examiner—Errol A. Krass
Assistant Examiner—Heather R. Herndon
Attorney, Agent, or Firm—Robert O. Nimtz

[57] ABSTRACT

In laying out integrated circuits on a substrate, the placement of the components relative to each other is important in minimizing conductor area and hence chip area. Large scale integration often uses polycells which are lined up in rows to realize the digital logic circuitry. A partitioning procedure is disclosed which iteratively separates the cells into maximally connected subcells, eventually to assign them to rows so as to minimize conductor area. A technique called terminal propagation takes into account at every iteration the location of connections outside of the partitioned area. Rectilinear Steiner trees are generated to aid in terminal propagation.

9 Claims, 7 Drawing Figures

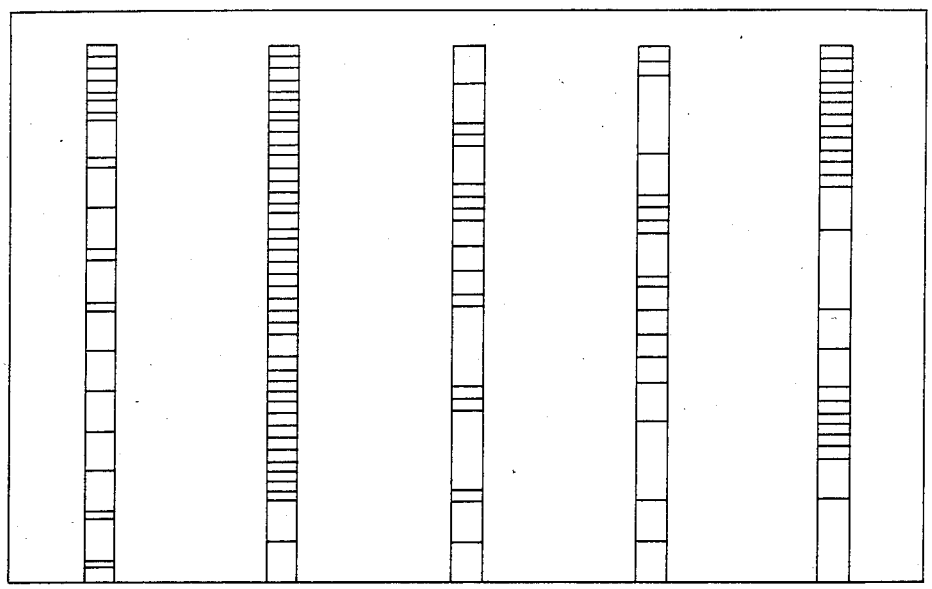

PLACEMENT OF COMPONENTS ON CIRCUIT SUBSTRATES

TECHNICAL FIELD

This invention relates to integrated circuit chip manufacture and, more particularly, to the placement of circuit modules on such chips to minimize the interconnection cost and to maximize the speed of operation.

BACKGROUND OF THE INVENTION

Integrated circuit technology has reduced the cost of electronic systems to the point where almost any member of the public can now own a computer which has capabilities which could have been found only in the largest industrial and military laboratories a short twenty years ago. The trend towards reduced size, reduced cost and the placement of more and more components on a single chip has continued unabated. VLSI (Very Large Scale Integration) technology is the current terminology for the results of this trend. The present invention is in the VLSI technology.

One of the major problems in the VLSI technology is the following: given the logical design of a circuit, how can the components and/or circuit modules be best positioned to minimize the area (or length) of the interconnections between the modules. The primary purpose of this minimization is to enable the placement of as many instances of the chip as possible on a single semiconductor wafer, thereby reducing fabrication costs. Another purpose is to reduce the path length and delay and thus increase the speed of operation. One variant of this problem is the layout of a circuit made up of standard cells or "polycells" which can be laid out in rows of identical or near identical circuitry. Common signals such as power, ground and clocks are then routed through busses within the rows of cells. Terminals at the top and bottom of each cell are used to connect the cells to each other by conductive paths in the channels between the rows of cells.

One approach to the placement of circuit modules on an integrated circuit substrate was taken in U.S. Pat. No. 3,617,714, granted Nov. 2, 1971 and assigned to applicants' assignee. In this patent, the modules and their interconnections are treated as the vertices and edges, respectively, of a graph. Optimum, or near optimum, partition of the vertices of the graph are obtained by creating an arbitrary partition and then iteratively exchanging pairs or groups of vertices to find a better partition, i.e., a partition with fewer interpartition edges. Once partitioned, each subset is itself partitioned, and so forth, until the relative positions of all of the circuit modules are closely circumscribed. The specific details of this approach and its mathematical justification can be found in the above-mentioned patent 3,617,714.

The technique of the above-noted Kernighan and Lin patent can be advantageously used to identify clusters of circuit components or polycells which can advantageously be placed close to each other. Unfortunately, however, other constraints on the placement of circuit modules must also be observed in any real placement of modules on integrated circuit chips. One such major constraint is the placement of the other integrated circuit modules, i.e., connectivity constraints outside of the placement subarea. Obviously, a component layout which does not take such external module placement constraints into account will be subject to significant placement errors which either must be corrected or else suffer the resulting increase in interconnection lengths. Indeed, any scheme which attempts to modify an optimized placement after the placement is selected so as to account for constraints like the terminals of external module placement runs the risk of losing any advantage thereby gained.

SUMMARY OF THE INVENTION

In accordance with the illustrative embodiment of the present invention, the positions of the external connections to an integrated circuit module are utilized at the beginning in selecting optimum or near optimum placements of modules on the integrated circuit substrate. Thereafter, on successive iterations, network connection terminals having position-sensitive placement constraints outside the placement area are likewise integrated into the placement strategy. This technique can be called "terminal propagation" since the position of the "terminal" (outside placement constraint) "propagates" throughout the placement procedure, insuring a final placement which takes these outside placement constraints into account.

More particularly, the outside placement constraint is identified as an area boundary crossing whose position on the edge of the area reflects the outside constraint. Other similar physical placement constraints can likewise be imposed using the same technique.

In accordance with one feature of the present invention, the terminal propagation property is obtained by computing a rectilinear Steiner tree on the terminals outside the area being partitioned. The Steiner tree edges create the boundary crossings used for identifying the outside placement constraints. Other techniques for identifying boundary positions as placement constraints are readily available.

In accordance with another feature of the invention, the terminal propagating graph partitions and Steiner trees are realized by programming a general purpose digital computer to perform the necessary analysis and heuristic steps.

BRIEF DESCRIPTION OF THE DRAWINGS

In the drawings:

FIG. 6 is a graphical representation of a subdivided chip substrate divided into horizontal row areas to which the partitioned subareas are assigned; and FIG. 7 is a graphical illustration of a typical row layout of polycells positioned in accordance with the present invention.

DETAILED DESCRIPTION

The design of integrated circuits involves the following steps:
1. Functional design of the circuit.
2. Design of the standard or custom-tailored modules used to realize the functions.
3. Logical design of the overall circuit.
4. Placement of the standard and custom modules on the substrate.
5. Routing of conductors between the modules.
6. Preparation of masks.
7. Fabrication.

Of these steps, possibly the module placement step is the most critical in maximizing both the number of components that can be realized on a chip, maximizing the number of instances of a chip that can be realized on a semiconductor wafer, and maximizing the speed of operation of the overall circuit.

Much of the placement is now done by hand, or interactively with a computer, i.e., a skilled designer, using his knowledge of the interconnectivity of the modules and the location of outside connection points, places the modules on the chip in such a manner as to minimize the length and area of the interconnecting wires. This leaves more room for modules, thus reducing the size of the chip for a given number of standard modules.

The present invention represents a significant step in the direction of automating this module placement step so as to reduce the cost and the time required to place modules on an integrated circuit chip.

Figure 1:
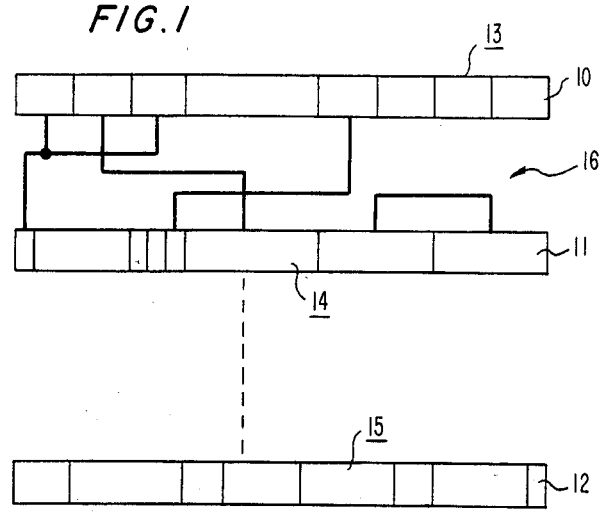
FIG. 1 is a graphical representation of an integrated circuit chip in which polycells are arranged in rows.

An exemplary polycell chip layout is illustrated in FIG. 1. Rows 10, 11 and 12 are each comprised of a plurality of standard modules, such as modules 13, 14 and 15, which are designed to fit together into rows. The modules all have the same height and can be abutted in long rows. Common signals like power, ground and clock signals are made at the boundaries between polycells, while other circuit interconnection are routed through channels, like channel 16, between the rows of modules. Horizontal and vertical conductors can be placed on distinct layers in the channel 16 such that there is no electrical connection between them unless one is explicitly created. It is common to use such a standard polycell layout for digital logic design as well as for iterative structures like semiconductor memories and register banks. The present invention, however, is not limited to polycell layouts and can be applied to any integrated circuit chip or subchip having interconnected circuit modules.

B. W. Kernighan and S. Lin U.S. Pat. No. 3,617,714, granted Nov. 3, 1971, discloses a technique which can be used for minimizing the area of conductors interconnecting components in integrated circuit chips. In general, the technique uses graph representation of the area cost factors for interconnection to "partition" the circuit modules into "clusters" of high interconnected modules with minimal interconnection between different clusters. Various other techniques for identifying clusters have been identified as partitioning, nested bisection and min-cut placement and are described in the following references:

1. U. Lauther, "A Min-Cut Placement Algorithm for General Cell Assemblies Based on Graph Partitioning," *Proc. 16th Design Automation Workshop* (June, 1979).

2. M. Burstein, "Partitioning of VLSI Networks," *Proc. 19th Design Automation Workshop* (1982).

3. D. C. Schmidt and L. E. Druffel, "An Iterative Algorithm for Placement and Assignment of Integrated Circuits," *Proc. 12th Design Automation Workshop* (1975).

4. L. I. Corrigan, "A Placement Capability Based on Partitioning," *Proc. 16th Design Automation Workshop* (1979).

5. M. A. Breuer, "Min-Cut Placement," *J. Design Automation & Fault Tolerant Computing* 1(4), pp. 343-362 (October, 1977).

Each of these techniques requires the logical interconnectivity of the circuit to be represented by a graph with the components as nodes and the interconnections as edges. The problem then is to iteratively partition the nodes into two subsets, each of which includes approximately one-half of the original nodes, in such a way as to minimize the number of edges interconnecting the two subsets. One approach is to divide the nodes arbitrarily and use an iterative nodeinterchange technique to gradually improve the selection of which nodes go into which cluster. The aforementioned Kernighan et al. patent uses this technique.

In accordance with the present invention, the partitioning procedure is significantly improved by a technique called "terminal propagation." The position of external connections (external module terminals and connection pads, for example) are used to guide the partitioning process. That is, the location of signals that enter a group of circuit modules from the outside is used as a constraint on the partitioning of that group.

Figure 2:
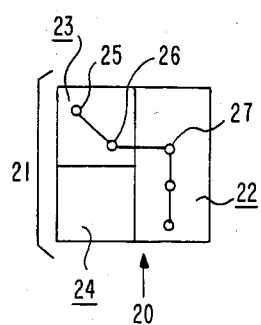
FIG. 2 is a graphical illustration of the results of a typical partition and subpartition of the area of the chip substrate.

Taking the simplest case, the semiconductor chip has a plurality of connection pads to which connections can be made to the outside world. These pads are fixed around the periphery of the chip but must be connected to appropriate terminals on circuit modules inside the chip. Clearly, all other things being equal, modules connected to a particular external connection pad should be constrained to remain in the cluster which is closest to that external connection pad. What is true of the first partitioning (in order to take care of the connection pads) is also true of every subsequent stage of partitioning. For example, suppose the modules are partitioned into right and left clusters and each of these clusters is to be partitioned into upper and lower subclusters. As can be seen in FIG. 2, the integrated circuit chip area 20 is divided into a left cluster 21 and a right cluster 22. After one of the clusters, e.g., the left cluster 21, is partitioned into upper subcluster 23 and lower subcluster 24, it is desired to partition the other cluster (the right cluster 22) into upper and lower subclusters. Signal nets 25 and 26, (i.e., terminals on circuit modules) which are located in the upper subcluster 23, are connected to a signal net 27 in right cluster 22. We now wish to partition the right cluster 22 into an upper and a lower subcluster. It is highly desirable to bias the partitioning process towards putting module 27, connected to modules 25 and 26 in the upper left subcluster 23, into the upper subcluster of right cluster 22. This technique of taking outside connections into account at each and every level of partitioning is called "terminal propagation." Such terminal propagation and one advantageous technique for accomplishing terminal propagation, are the subject matter of the present invention.

Figure 3:
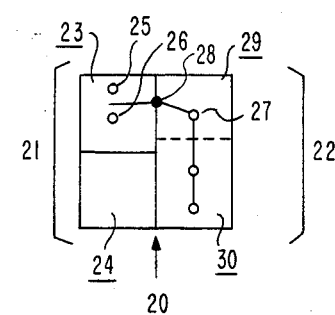
FIG. 3 is a graphical illustration of the terminal propagation technique helpful in subpartitioning the partition of FIG. 2.

Terminal propagation can be accomplished, as one illustrative example, by the technique illustrated in FIG. 3. In the absence of any other information, the modules 25 and 26 are assumed to be at the geometrical center of the area 23 defining the left upper cluster of cells. The chip area is divided two subareas 22 and 23 proportional to the areas of the modules in the cluster contained therein. If more specific information is known about the location of the outside connection (e.g., the fixed or estimated position of an external module terminal) then that information is used to position the signal net appropriately at the periphery of the cluster area. The position of the signal net is thus propagated to the closest point, point 28, of the intercluster boundary. Point 28, then, is treated as a pseudo-module which is constrained to stay with the upper right subcluster during partitioning. This technique appropriately biases the partitioning process to favor the placement of cell 27 in the upper subcluster 29 of the right cluster 22, all other things being equal. Of course, this bias can be overcome by other stronger connectivity constraints tending to place cell 27 in lower subcluster 30.

The process described in connection with FIG. 3 is the essence of terminal propagation. It should be noted, however, that if the position propagated to the intercluster boundary falls at the center of the cluster to be partitioned, it should have no biasing effect on the partition. This is true, for example, when partitioning the cluster 21 into subclusters 22 and 23 (FIG. 2). If all the cells of cluster 22 are assumed to be at the geometric center of area 22, then this position, when propagated to the intercluster boundary, will fall on or near the center or axis of the left cluster partition. In this position, the outside connectivity should have no effect on the left cluster partition. For simplicity, the entire central third of the intercluster boundary can be excluded from the biasing procedure and connection points propagated to only the two outer thirds produce a biasing net point in the partitioning process.

Figure 4:
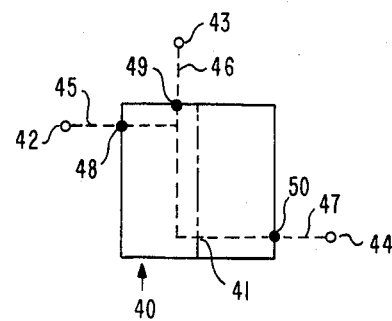
FIG. 4 is a graphical illustration of a typical Steiner tree on three external connection points illustrating the terminal propagation technique.

A convenient technique for projecting module locations perpendicularly to the closest intercluster boundary is by constructing a low-cost rectilinear Steiner tree on all of the terminals external to the area to be partitioned. In FIG. 4, for example, the area 40 is to be partitioned along vertical axis 41. The external terminals to be connected to modules in area 40 are terminals 42, 43 and 44. The rectilinear Steiner tree is represented by the dotted lines 45, 46 and 47 interconnecting terminals 42, 43 and 44, respectively. The dotted lines 45, 46 and 47 are constrained to be orthogonal and parallel to the boundaries of the area to be partitioned and hence are "rectilinear." A method for calculating such rectilinear Steiner trees is shown in the article "The Rectilinear Steiner Problem," by F. K. Hwang, *Journal Of Design Automation And Fault-Tolerant Computing*, Vol. 2, pp. 303–310, 1979.

The rectilinear Steiner tree generation is simply one way of generating the appropriate boundary crossings. Other techniques, while not quite as optimal, may be easier to calculate and hence sometimes preferable. Simple straight lines from the external terminals to the center of the area being partitioned would, for example, produce useful boundary crossings. Similarly, a single boundary crossing to the center of gravity of the polygon formed by interconnecting the outside terminals would provide a useful bias. A minimum spanning tree of the outside points would likewise provide a useful technique for calculating the biasing point. The rectilinear Steiner tree, although somewhat more difficult to compute than some of the others, has been chosen in the preferred embodiment as the best optimization technique.

Returning to FIG. 4, the points of intersection, points 48, 49 and 50, of the Steiner tree with the boundaries of area 40 are determined. Each of points 48, 49 and 50 is treated as a pseudo-module fixed in the left or right subclusters during partitioning. Again, the central third of the sides perpendicular to the axis of partitioning are excluded. Thus, point 49 is excluded while points 48 and 50 are included as fixed module terminals. If partitioning were being done on a horizontal axis, all three points 48, 49 and 50 would be included.

Figure 5:
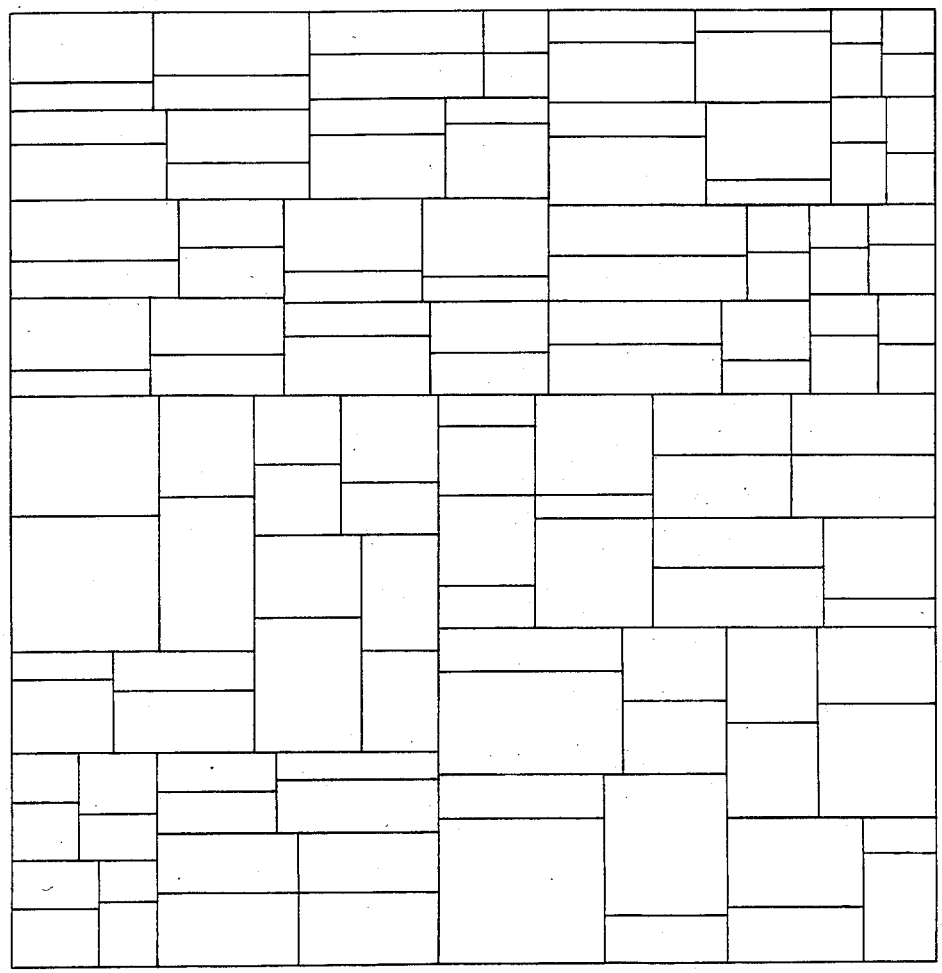
FIG. 5 is a graphical representation of an integrated circuit chip partitioned into 412 subareas in accordance with the present invention.

The iterative application of the partitioning process to successively smaller subclusters, and the assignment of subareas proportional to the sum of the areas of the included modules results in dividing the chip area into a plurality of subareas representing preferred locations for all of the modules on the chip. FIG. 5 discloses an illustration of a chip divided into 128 subareas each including six or less modules or cells. Any known routing algorithm can then be used to interconnect the module terminals with minimum length interconnections. One such algorithm is shown in "Net Wiring For Large Scale Integrated Circuits," by M. Hanan, *IBM Technical Report* RC 1377, February 1965.

It will be recalled that it is often desired to place the modules in rows in many types of integrated circuits. To this end, the modules clustered in FIG. 5 must, therefore, be assigned to rows so as to reflect the positions suggested by the area boundaries of FIG. 5. This is accomplished as follows.

Referring to FIG. 6, there is shown a chip divided into 32 clusters of cells or modules. Assuming that these modules are to be arranged into five horizontal rows, the entire chip area of FIG. 6 is divided into five equal horizontal strips by horizontal lines 60, 61, 62 and 63. Modules in subareas entirely within a horizontal strip are assigned to the corresponding row. Modules from areas which are split by the row boundaries 60 through 63 are divided between the rows. Moreover, the division is such that the cells are apportioned to the two rows in proportion to the fraction of the area that lies within the respective row boundaries. As can be seen in FIG. 6, many of the subareas are so divided, as represented by the row assignments in the areas.

This process keeps the related modules together and tends to keep the lengths of the rows equal. The selection of the particular cells assigned to rows from overlapping areas can be adjusted to equalize the row lengths, or to adjust the row lengths to other desired configurations. In FIG. 7 there is shown a typical row assignment corresponding to the partitions of FIG. 6. It can be seen that the rows are essentially equal in length.

The process described above can be summarized as pseudocode and is shown in Appendix A. The "Main" procedure calls five subroutines called "divide", "propagate", "Steiner tree", "partition" and "assign".

APPENDIX

Notation:
 S=number of modules in set S
 [S]=sum of areas of modules in set S
Main procedure:
 input data, parameters, etc.:
  S: set of modules
  R: number of rows
  primary axis for rows
  divide (set S, primary axis) into sets
  assign sets to R rows parallel to primary axis
 divide (set S, axis A):

```
if S> =minimum set size
    propagate terminals (S, A
    partition (S, A) into sets S1, S2
    area S1=[S1]/(S[1]+S[2]) * area S
    area S2=[S2]/(S[1]+S[2]) * area S
    divide (S1, axis perpendicular to A)
    divide (S2, axis perpendicular to A)
else
    finished with set S
propagate terminals (set S, axis A):
    for each net N connecting module in S to module
        outside S
        Steiner tree (S, N) for external module terminals on
            N
        compute intersections of Steiner tree with S
        if there are no intersections make one on closest
            side
        add one pseudo-module to S1 and one to S2 for
            each intersection I
            if I is on S1 side
                add a connection from I to S1 pseudo-module
            else
                add a connection from I to S2 pseudo-module
Steiner tree (set S, net N):
    sort terminals on N outside of S from left to right
    for each sorted terminal starting with leftmost route
        to the next net from the closest terminal or previ-
        ous point on this net (go left to right, then verti-
        cally)
    repeat for other three directions
    choose shortest tree
partition (set S, axis A):
    split S into S1 and S2 by dividing the area parallel to
        axis A such that
        S1≈=S2
    minimize #nets joining modules in S1 to modules in
        S2
assign sets to rows:
    divide area S into R strips of desired size parallel to
        desired axis
    for each set Si chosen in order of x,y of its center
        if Si is entirely within strip r
            assign its modules to row r
        else
            assign f of its modules to row r, where f is the
                fraction of Si's area within row r
```

What is claimed is:

1. An integrated circuit fabricated in accordance with a design procedure comprising the steps of
   (a) determining a plurality of modules of integrated circuit components from which said integrated circuit can be fabricated,
   (b) successively partitioning said plurality of modules into successively smaller subsets of modules maximally connected within subsets and minimally connected between subsets in accordance with a known partitioning algorithm,
   (c) successively dividing the area of a substrate into subareas proportional to the areas of the polycells in said subsets,
   (d) placing said modules on said substrate in accordance with the subarea location to which said modules are assigned, and
   (e) propagating connections to terminal external to each of said subareas to the periphery of the respective subareas prior to said partitioning step.

2. The integrated circuit of claim 1 further fabricated in accordance with a design procedure including the step of
   (f) computing a rectilinear Steiner tree on all of said terminals external to said subareas, and
   (g) using the intersections of said Steiner tree with the periphery of said subarea as the projection of said external terminal.

3. The integrated circuit of claim 2 further fabricated in accordance with a design procedure including the step of
   (h) ignoring all of said intersections centrally located on the boundary between said subareas.

4. The method of designing integrated circuits comprising the steps of
   (a) determining a plurality of modules of integrated circuit components from which said integrated circuit can be fabricated,
   (b) successively partitioning said plurality of modules into successively smaller subareas of modules maximally connected within subsets and minimally connected between subsets in accordance with a known partitioning algorithm,
   (c) successively dividing the area of a substrate with subareas proportional to the areas of said modules in said subsets,
   (d) assigning said modules to locations on the integrated circuit substrate in accordance with the locations of said subareas to which the respective modules are assigned, and
   (e) propagating connections from elements external to each of said subareas to the periphery of the respective subarea prior to said partitioning steps.

5. The method of designing integrated circuits according to claim 4 further including the steps of
   (f) computing a rectilinear Steiner tree on all of said connections external to said subareas, and
   (g) using the intersections of said Steiner tree with the periphery of said subareas as the projection of said external connection.

6. The method of designing integrated circuits according to claim 5 further including the steps of
   (h) ignoring all of said intersections centrally located on the boundary between said subareas.

7. An integrated circuit fabricated in accordance with a design procedure comprising the step of
   (a) determining a plurality of polycells of integrated circuit components from which said integrated circuit can be fabricated,
   (b) successively partitioning said plurality of polycells into successively smaller subareas of polycells maximally connected between subsets in accordance with a known partitioning algorithm,
   (c) successively dividing the area of a substrate with subareas proportional to the area of said polycells in said subsets,
   (d) dividing said substrate into horizontal or vertical areas corresponding in number to the desired number of rows of said polycells,
   (e) assigning said polycells to rows in accordance with the proportion of said subareas falling into the corresponding horizontal area and,
   (f) propagating connections from elements external to each of said subareas to the periphery of the respective subarea prior to said partitioning step.

8. The method of designing integrated circuits according to claim 7 further including the steps of
   (g) computing a rectilinear Steiner tree on all of said connections external to said subareas, and
   (h) using the intersections of said Steiner tree with the periphery of said subarea as the projection of said external connection.

9. The method of designing integrated circuits according to claim 8 further including the step of
   (i) ignoring all of said intersections centrally located on the boundary between said subareas.

* * * * *